US010255783B2

United States Patent
Park et al.

(10) Patent No.: US 10,255,783 B2
(45) Date of Patent: Apr. 9, 2019

(54) APPARATUS FOR MONITORING BRAKE MOTOR

(71) Applicants: Hyundai Motor Company, Seoul (KR); Kia Motors Corporation, Seoul (KR); HANJINFAS, Busan (KR)

(72) Inventors: Min Hyeon Park, Gyeonggi-do (KR); Young Gee Kim, Busan (KR)

(73) Assignees: Hyundai Motor Company, Seoul (KR); Kia Motors Corporation, Seoul (KR); HANJINFAS, Busan (KR)

( * ) Notice: Subject to any disclaimer, the term of this patent is extended or adjusted under 35 U.S.C. 154(b) by 0 days.

(21) Appl. No.: 15/696,658

(22) Filed: Sep. 6, 2017

(65) Prior Publication Data

US 2018/0082567 A1   Mar. 22, 2018

(30) Foreign Application Priority Data

Sep. 20, 2016   (KR) ........................ 10-2016-0120287

(51) Int. Cl.
| G08B 21/18 | (2006.01) |
| H02K 11/20 | (2016.01) |
| H02K 7/108 | (2006.01) |
| H02K 11/04 | (2016.01) |
| H02P 3/04 | (2006.01) |
| H02P 29/024 | (2016.01) |

(52) U.S. Cl.
CPC ............. *G08B 21/18* (2013.01); *H02K 7/108* (2013.01); *H02K 11/04* (2013.01); *H02K 11/20* (2016.01); *H02P 3/04* (2013.01); *H02P 29/027* (2013.01)

(58) Field of Classification Search
CPC combination set(s) only.
See application file for complete search history.

(56) References Cited

U.S. PATENT DOCUMENTS

2007/0296265 A1* 12/2007 Bourke ................. A47B 53/02
303/3
2014/0252998 A1* 9/2014 Rutkowski ............... H02P 3/06
318/380

FOREIGN PATENT DOCUMENTS

| JP | 5534716 B2 | 7/2014 |
| KR | 10-0270105 | 7/2000 |
| KR | 10-1046069 | 6/2011 |

\* cited by examiner

*Primary Examiner* — Travis R Hunnings
(74) *Attorney, Agent, or Firm* — Mintz Levin Cohn Ferris Glovsky and Popeo, P.C.; Peter F. Corless (57) ABSTRACT

An apparatus for monitoring a motor brake is provided. The apparatus includes a monitoring portion that is configured to measure state information of the brake motor having a motor and a brake device. The monitoring portion also determines a state of the brake device based on the state information and a control signal output by a brake motor controller that operates the brake motor or adjusts a control current supplied to the brake device.

19 Claims, 7 Drawing Sheets

| Control signal of brake device | Control signal of brake breaker | Brake breaker → Rectifier | Rectifier → Brake device | State |
|---|---|---|---|---|
| Open signal | ON | AC ON | DC ON | Normal |
| | ON | AC ON | DC OFF | Rectifier is abnormal / Disconnection of coil |
| | ON | AC OFF | DC OFF | Disconnection of brake breaker |
| | ON | AC/DC is beyond normal range | | Brake gap is abnormal |
| Close signal | OFF | AC OFF | DC OFF | Normal |
| | OFF | AC ON | DC ON | Contact points of brake breaker are Short-circuited |
| Remark | | | AC current applied state | Rectifier is abnormal |

APPARATUS FOR MONITORING BRAKE MOTOR

CROSS-REFERENCE TO RELATED APPLICATION

This application claims priority to and the benefit of Korean Patent Application No. 10-2016-0120287 filed in the Korean Intellectual Property Office on Sep. 20, 2016, the entire contents of which are incorporated herein by reference.

BACKGROUND

(a) Field of the Invention

The present invention relates to an apparatus for monitoring a brake motor, and more particularly, to an apparatus for monitoring a brake motor that manages state information of the brake motor in real time to prevent stoppage of operation of a production line by the brake motor.

(b) Description of the Related Art

A motor brake is an electric brake in a brake motor case. The motor brake is operated (engaged) when a current supplied thereto is cut off, and is not operated (disengaged) when a current is supplied thereto. The brake motor is used in various industrial applications. Particularly, various electric brake motors are applied to vehicle manufacturing processes, such as a press process, a vehicle body assembly process, a painting process, a designing process, and an inspecting process. However, various causes of breakage of the motor brake, such as, electrical and mechanical often occur.

An example of the electrical cause may be when Joule heat is rapidly increased when an over-current exceeding a rated current range is generated and a coil temperature is increased, and thus, coil insulation of the motor brake is broken and a circuit of the motor brake is short-circuited. Another example is when the insulation of the coil and a lead-in line of the motor brake are weakened by accumulated heat due to long-term usage of the brake motor, or the insulation of the coil of the motor brake is weakened by moisture or a corrosive gas, and thus electrical leakage occurs and the circuit of the motor brake is short-circuited.

An example of the mechanical cause may be when the operation of the brake motor is stopped by abrasion of a friction plate of a brake disk and a loss of restoring force of a spring for sustaining a brake gap of the motor brake. When the motor brake is broken by the various causes, a production line is stopped, and an excessive amount of time for solving the problem is consumed.

The above information disclosed in this section is merely for enhancement of understanding of the background of the invention and therefore it may contain information that does not form the prior art that is already known in this country to a person of ordinary skill in the art.

SUMMARY

The present invention provides an apparatus for monitoring a brake motor that may prevent stoppage of a production line in an industrial site by managing state information of the brake motor in real time.

An apparatus for monitoring a brake motor according to an exemplary embodiment of the present invention may include a monitoring portion configured to measure state information of the brake motor including a motor and a brake device, and determine a state of the brake device based on the state information and a control signal of a brake motor controller configured to operate the brake motor or a control current supplied to the brake device.

The monitoring portion may include: an alternating current (AC) current measuring instrument configured to measure an AC current supplied to a rectifier that converts the AC current into a direct-current (DC) current supplied to the brake device; a DC current measuring instrument configured to measure the DC current supplied to the brake device via the rectifier; a relay configured to selectively cut the AC current supplied to the rectifier; and a monitoring controller configured to transmit a state of the AC current and the DC current based on a control signal of the brake motor controller to the brake motor controller, determine a state of the brake device based on the state of the AC current and the DC current based on a control signal of the brake motor controller, and operate the relay.

The monitoring controller may be configured to determine that a disconnection occurs in a brake breaker that selectively cuts the AC current supplied to the brake device when the control signal of the brake device output by the brake motor controller is an open signal and an AC current does not flow at an upstream side of the rectifier. Additionally, the monitoring controller may be configured to determine that the rectifier is in an abnormal state or a disconnection occurs in a coil of the brake device when the DC current does not flow at a downstream side of the rectifier, or determine that the rectifier is in an abnormal state when the AC current flows at a downstream side of the rectifier.

The monitoring controller may further be configured to determine that a short-circuit occurs in a contact point of a brake breaker for selectively cutting the AC current supplied to the brake device when the control signal of the brake device output by the brake motor controller is a close signal and the AC current or the DC current supplied to the brake device flows. The monitoring controller may be configured to determine that a brake gap of the brake device is abnormal when the control signal of the brake device output by the brake motor controller is an open signal and the AC current at the upstream side of the rectifier is greater than a predetermined AC current or the DC current at the downstream side of the rectifier is greater than a predetermined DC current.

In addition, the monitoring controller may be configured to determine that an over-current is supplied to the brake device when the AC current or the DC current supplied to the brake device consistently exceeds an upper limit value for a predetermined time. The monitoring controller may be configured to determine that an over-current is supplied to the brake device when a number of inflection points of the AC current or the DC current supplied to the brake device that exceed an upper limit value exceeds a predetermined number for a predetermined time. The monitoring controller may further be configured to determine whether an over-current flows by comparing a squared value of the AC current or the DC current supplied to the brake device with a squared value of the upper limit value. The monitoring controller may then be configured to turn off the relay in response to determining that the brake device is in an abnormal state.

The apparatus for monitoring the motor brake may further include a manager server configured to connect with the monitoring portion via a wired or wireless network, wherein the monitoring controller may be configured to transmit an abnormal state signal to the manager server when the brake device is in an abnormal state. The apparatus for monitoring the motor brake may further include: a lamp electrically connected with the monitoring controller; and an alarm portion electrically connected to the brake motor controller, wherein the lamp and the alarm portion generate an alarm signal in response to the determination that the brake device is in an abnormal state.

The brake motor controller may be configured to determine that the rectifier is in an abnormal state or a coil of the brake device is disconnected when the control signal of the brake device output by the brake motor controller is an open signal, the control signal of the brake breaker selectively cutting off the AC current supplied to the brake device is an on signal, the AC current supplied to the rectifier flows, and the DC current supplied to the brake device through the rectifier flows. The brake motor controller may be configured to determine that the brake breaker is disconnected when the control signal of the brake device output by the brake motor controller is an open signal, the control signal of the brake breaker selectively cutting off the AC current supplied to the brake device is an on signal, the AC current supplied to the rectifier does not flow, and the DC current supplied to the brake device through the rectifier does not flow.

When the control signal of the brake device output by the brake motor controller is the open signal, the control signal of the brake breaker selectively cutting off the AC current for being supplied to the brake device is an on signal, and the DC current supplied to the brake device through the rectifier is beyond a normal range, the brake motor controller may be configured to determine that a brake gap of the brake device is abnormal. When the control signal of the brake device output by the brake motor controller is a close signal, the control signal of the brake breaker selectively cutting off the AC current for being supplied to the brake device is an off signal, the AC current for being supplied to the rectifier flows, and the DC current for being supplied to the brake device through the rectifier flows, the brake motor controller may be configured to determine that contact points of the brake breaker are short-circuited.

According to an exemplary embodiment of the present invention, it may be possible to determine whether a circuit forming the motor brake is in an abnormal state by measuring a current supplied to the motor brake in real time. In addition, it may be possible to prevent problems from occurring in circuits forming the motor brake in advance, and countermeasures may be rapidly established when the motor brake is re-broken.

BRIEF DESCRIPTION OF THE DRAWINGS

The drawings are provided for reference in describing exemplary embodiments of the present invention, and the spirit of the present invention should not be construed only by the accompanying drawings.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The present invention will be described more fully hereinafter with reference to the accompanying drawings, in which exemplary embodiments of the invention are shown.

As those skilled in the art would realize, the described exemplary embodiments may be modified in various different ways, all without departing from the spirit or scope of the present invention.

In describing the present invention, parts that are not related to the description will be omitted. Like reference numerals generally designate like elements throughout the specification. In addition, the size and thickness of each configuration shown in the drawings are arbitrarily shown for better understanding and ease of description, but the present invention is not limited thereto. In the drawings, the thicknesses of layers, films, panels, regions, etc., are exaggerated for clarity.

Figure 1:
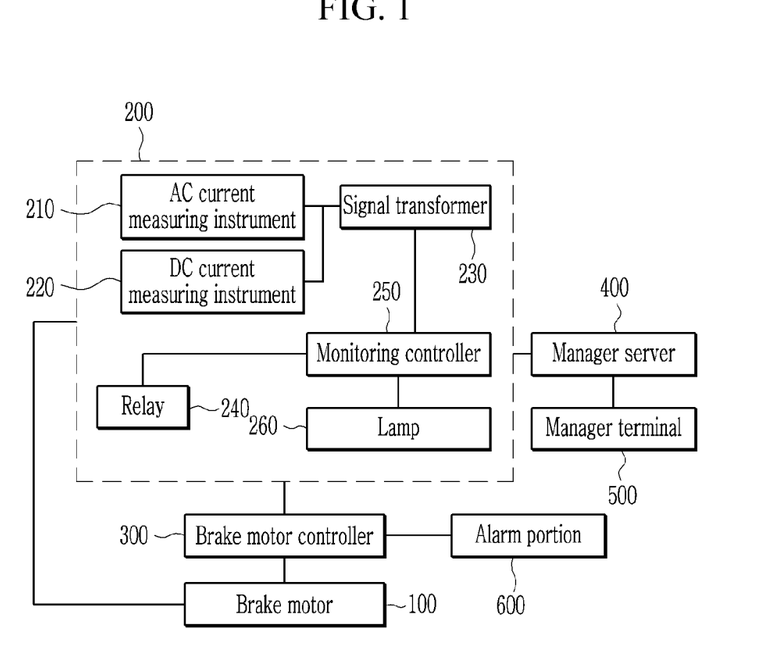
FIG. 1 is a block diagram illustrating an apparatus for monitoring a motor brake according to an exemplary embodiment of the present invention.
Figure 2:
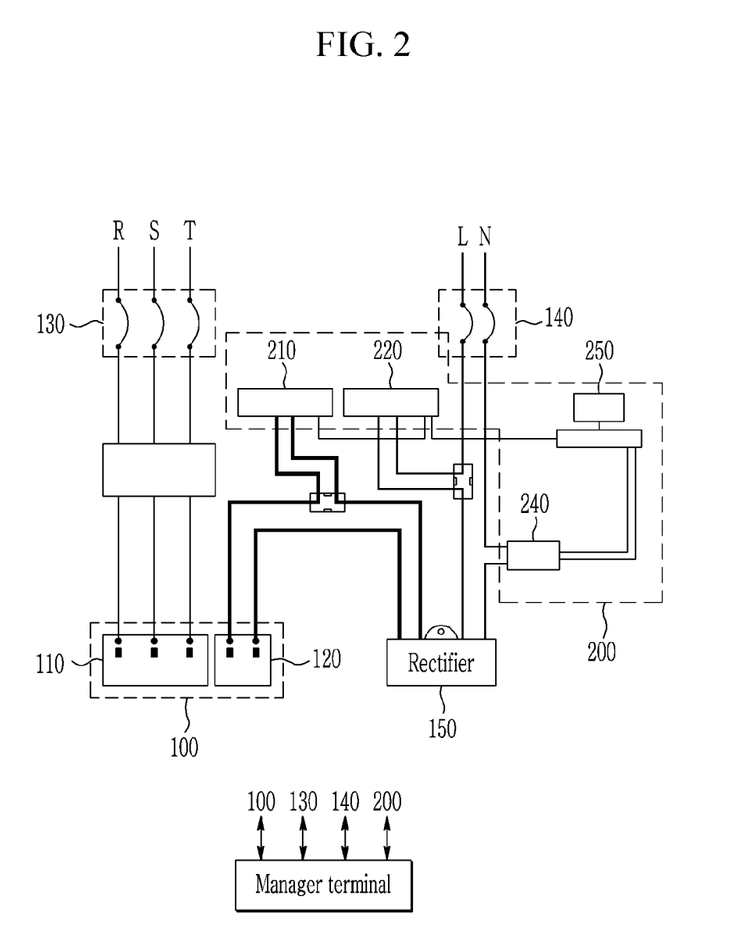
FIG. 2 is a circuit diagram illustrating an apparatus for monitoring a motor brake according to an exemplary embodiment of the present invention.

Hereinafter, an apparatus for monitoring a brake motor according to an exemplary embodiment of the present invention will be described in detail with reference to accompanying drawings. FIG. 1 is a block diagram illustrating an apparatus for monitoring a brake motor according to an exemplary embodiment of the present invention. FIG. 2 is a circuit diagram illustrating an apparatus for monitoring a brake motor according to an exemplary embodiment of the present invention.

As shown in FIG. 1 and FIG. 2, an apparatus for monitoring a brake motor according to an exemplary embodiment of the present invention may include a brake motor 100 having a motor 110 and a brake device 120; a motor breaker 130 configured to selectively cut off power supplied to the motor 110 of the brake motor 100; a brake breaker 140 configured to selectively cut off power supplied to the brake device 120; a brake motor controller 300 configured to operate the brake motor 100; a rectifier 150 configured to convert AC supplied to the brake device 120 to DC, and a monitoring portion 200 configured to measure state information of the brake device 120, transmit the state information to the brake motor controller 300, determine a state of the brake device 120 based on a control signal of the brake motor controller 300 and the state information, and adjust a current supplied to the brake device 120. The brake motor 100 may include the motor 110 and the electric brake device 120 connected with the motor 110 and the motor 110 may be a three-phase motor.

Figure 3:
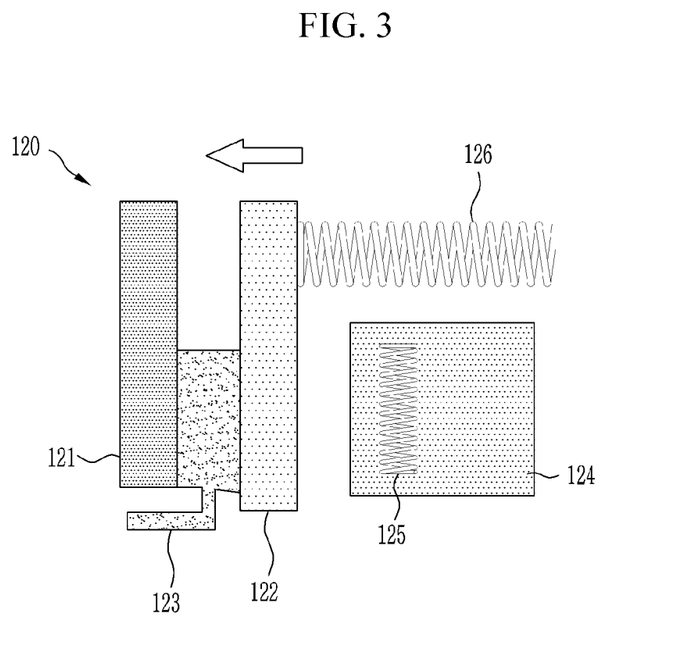
FIG. 3 and FIG. 4 are drawings illustrating a brake device of a motor brake according to an exemplary embodiment of the present invention.
Figure 4:
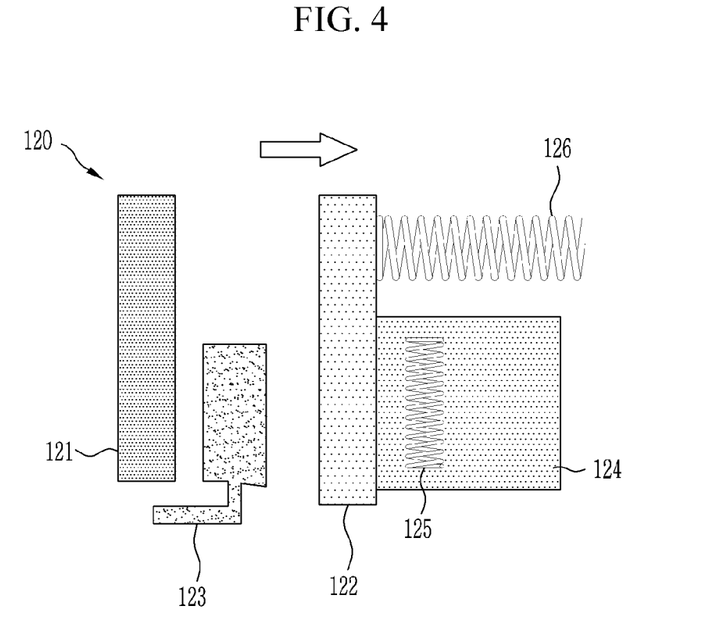

As shown in FIG. 3 and FIG. 4, the brake device 120 may include a fixed plate 121, an operation plate 122, a brake lining 123 disposed between the fixed plate 121 and the operation plate 122, an electromagnet 124 that generates magnetic force to selectively engage the fixed plate 121 and the operation plate 122, and a spring 126 that generates elastic force in a direction in which the operation plate 122 may be engaged with the fixed plate 121.

In particular, the brake lining 123 is a friction element disposed between the fixed plate 121 and the operation plate 122. A coil 125 may be disposed in the electromagnet 124, and magnetic force may be generated to disengage the operation plate 122 from fixed plate 121 when current flows in the coil 125. The electromagnet 124 may be operated by a control signal of the brake motor controller 300. The spring 126 provides elastic force in a direction in which the operation plate 122 is engaged with the fixed plate 121 in a normal state in which the brake is actuated. Hereinafter, an operation of the motor brake 110 will be described.

Referring to FIG. 4, when a control signal of the motor 110 output by the brake motor controller 300 is an on signal, e.g., the motor 110 is operated, the motor breaker 130 may be turned on by the control signal of the brake motor controller 300, and the three-phase motor 110 may be operated by supplying three-phase current to the motor 110. At this time, the brake breaker 140 may be turned on, and current may be supplied to the coil 125 of the electromagnet 124 through the rectifier 150, to thus disengage the operation plate 122 from the fixed plate 121.

Furthermore, referring to FIG. 3, when the control signal of the motor 110 output by the brake motor controller 300 is an off signal, e.g., the motor 110 is not operated, the motor breaker 130 may be turned off by the control signal of the brake motor controller 300, and the three-phase motor 110 is not operated since three-phase current is not supplied to the motor 110. At this time, since the brake breaker 140 is off and current is not supplied to the coil 125 of the electromagnet 124 through the rectifier 150, the operation plate 122 may be engaged with the fixed plate 121 by elastic force of the spring 126.

The brake breaker 140 and the motor breaker 130 are each a type of switch, and the brake breaker 140 and the motor breaker 130 may be operated by the control signal of the brake motor controller 300. Additionally, the monitoring portion 200 may include an AC current measuring instrument 210 (e.g., a sensor) configured to measure AC current supplied to the brake device 120, a DC current measuring instrument 220 (e.g., a sensor) configured to measure DC current supplied to the brake device 120, a relay 240 configured to selectively block AC current supplied to the rectifier 150, and a monitoring controller 250 configured to transmit states of the DC current and the AC current measured by the measuring instruments 210 and 220 to the brake motor controller 300, determine a state of the brake device 120 based on the state of the AC current and the DC current according to the control signal of the brake motor controller, and operate the relay 240.

The AC current measuring instrument 210 may be a non-contact AC current sensor configured to measure AC current and the DC current measuring instrument 220 may be a non-contact DC current sensor configured to measure DC current. The rectifier 150 may be configured to convert the AC current to the DC current. The AC current measuring instrument 210 may be configured to measure AC current at the upstream side of the rectifier 150, and the DC current measuring instrument 220 may be configured to measure DC current at the downstream side of the rectifier 150. The AC current measured by the AC current measuring instrument 210 and the DC current measured by the DC current measuring instrument 220 may be transmitted to the monitoring controller 250 via a signal transformer 230.

The apparatus for monitoring the motor brake according to an exemplary embodiment of the present invention may further include the motor breaker 130 configured to selectively block current supplied to the brake motor 100 and the three-phase motor 110, and the brake breaker 140 configured to selectively block current supplied to the brake device 120 of the brake motor 100. The motor breaker 130 and the brake breaker 140 may be operated by a control signal of the monitoring controller 250 passing through the brake motor controller 300.

The apparatus for monitoring the motor brake may further include a manager server 400 connected with the monitoring portion 200 via a wired or wireless network, and a manager terminal 500 connected with the manager server 400 via a wired or wireless network. The networks may be configured by an Ethernet or a data bus. The apparatus for monitoring the motor brake may further include a lamp 260 electrically connected with the monitoring controller 250 and an alarm portion 600 electrically connected with the brake motor controller 300. The lamp 260 and the alarm portion 600 may be configured to generate alarm signals. The lamp 260 may be a light bar and the alarm portion 600 may be a light bar or a siren.

The brake motor controller 300 may be configured to operate the three-phase motor 110 and the brake device 120 of the brake motor 100, and the control signal of the brake motor controller 300 may be transmitted to the monitoring controller 250. The monitoring controller 250 may then be configured to determine a state of the brake device 120 based on the state of the AC current and the DC current according to the control signal of the brake motor controller 300, and then operate the relay 240. Accordingly, the brake motor controller 300 and the monitoring controller 250 may be configured by one or more processors which are operated by a preset program, and the preset program is configured to perform respective steps of a method of controlling the brake motor 100 according to the exemplary embodiment of the present invention.

A method for determining whether the motor brake 110 is in a normal state or an abnormal state using the monitoring controller 250 will now be described. The monitoring controller 250 may be configured to determine that a disconnection occurs in the brake breaker 140 when the control signal of the brake device 120 output by the brake motor controller 300 is an open signal and the AC current does not flow at the upstream side of the rectifier 150. Herein, the open signal is a control signal output by the brake motor controller 300 to disengage the operation plate 122 and the fixed plate 121.

The monitoring controller 250 may be configured to determine that the rectifier 150 is in an abnormal state or the coil 125 of the brake device 120 is disconnected when the control signal of the brake device 120 output by the brake motor controller 300 is the open signal and the DC current does not flow at the downstream side of the rectifier 15. The monitoring controller 250 may be configured to determine that the rectifier 150 is in an abnormal state when the control signal is the open signal of the brake device 120 output by the brake motor controller 300 and the AC current flows at the downstream side of the rectifier 150.

Further, the monitoring controller 250 may be configured to determine that a brake gap between the fixed plate 121 and the operation plate 122 is abnormal when the control signal of the brake device 120 output by the brake motor controller 300 is the open signal, and the AC current at the upstream side of the rectifier 150 is greater than a predetermined AC current or the DC current at the downstream side of the rectifier 150 is greater than a predetermined DC current. The monitoring controller 250 may be configured to determine that contact points of the brake breaker 140 are short-circuited when the control signal of the brake device 120 output by the brake motor controller 300 is a close signal and the AC current or the DC current flows in the brake device 120. Herein, the close signal is the control signal output by the brake motor controller 300 to engage the operation plate 122 and the fixed plate 121.

Accordingly, when circuit parts forming the brake device 120 are in an abnormal state, the monitoring controller 250 may be configured to cut off the AC current supplied to the brake device 120 by operating the relay 240, transmit the abnormal state signal of the brake device 120 to the brake motor controller 300 and the manager server 400, or operate the lamp 260 and the alarm portion 600 to generate an alarm.

Figure 5:
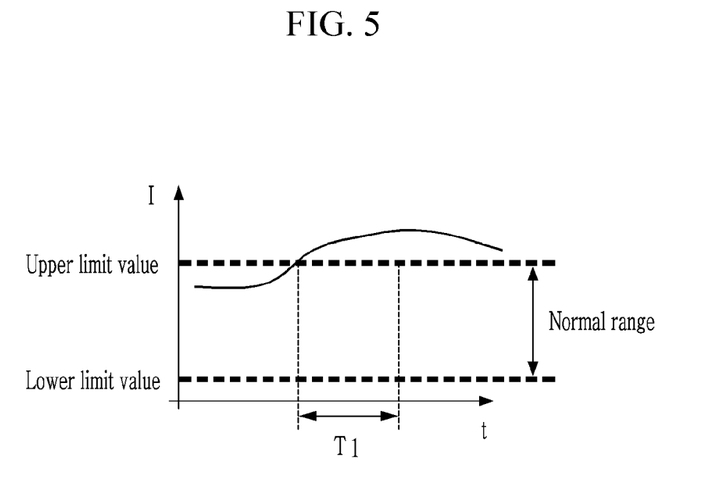
FIG. 5 and FIG. 6 are graphs illustrating AC current and DC current according to an exemplary embodiment of the present invention.

Hereinafter, a method of determining whether an over-current is supplied to the brake device 120 will be described in detail. Referring to FIG. 5, the monitoring controller 250 may be configured to determine that an over-current is supplied to the brake device 120 when the AC current or the DC current supplied to the brake device 120 consistently exceed an upper limit value for a predetermined time T1 (e.g., about 2 seconds). In other words, when the AC current or the DC current does not consistently exceed the upper limit value for the predetermined time, the monitoring controller 250 may be configured to determine a temporary phenomenon and does not determine that the circuit forming the brake device 120 is in an abnormal state.

Figure 6:
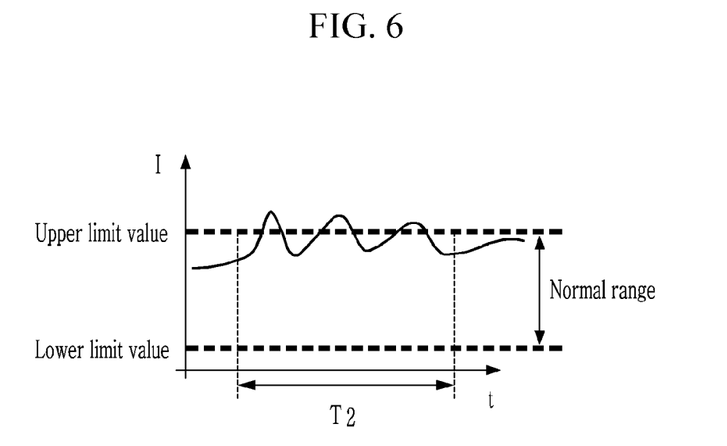

Referring to FIG. 6, the monitoring controller 250 may be configured to determine that an over-current is supplied to the brake device 120 when the number of inflection points of the AC current or the DC current supplied to the brake device 120 that exceed the upper limit value exceeds a predetermined number (e.g., about 3) for a predetermined time T2 (e.g., about 4 seconds). Unlike FIG. 5, even when the AC current or the DC current supplied to the brake device 120 does not consistently exceed the predetermined time T1 (e.g., about 2 seconds), the monitoring controller 250 may be configured to determine that an over-current is supplied to the brake device 120 when the number of inflection points of the AC current or the DC current exceeding the upper limit value exceeds the predetermined number for the predetermined time T2.

As shown in FIG. 5 and FIG. 6, the monitoring controller 250 may be configured to determine whether an over-current is supplied to the brake device 120 by comparing a squared value of the AC current or the DC current with a squared value of the upper limit value. By comparing the squared value of the AC current or the DC current with the squared value of the upper limit value, it may be possible to more accurately determine whether an over-current is supplied to the brake device 120 since a difference between the measured AC current or DC current and the upper limit value is amplified. For the AC current, the monitoring controller 250 may be configured to determine whether an over-current is supplied to the brake device 120 based on a root mean square (RMS) value of the AC current or an average value of the AC current.

Figure 7:
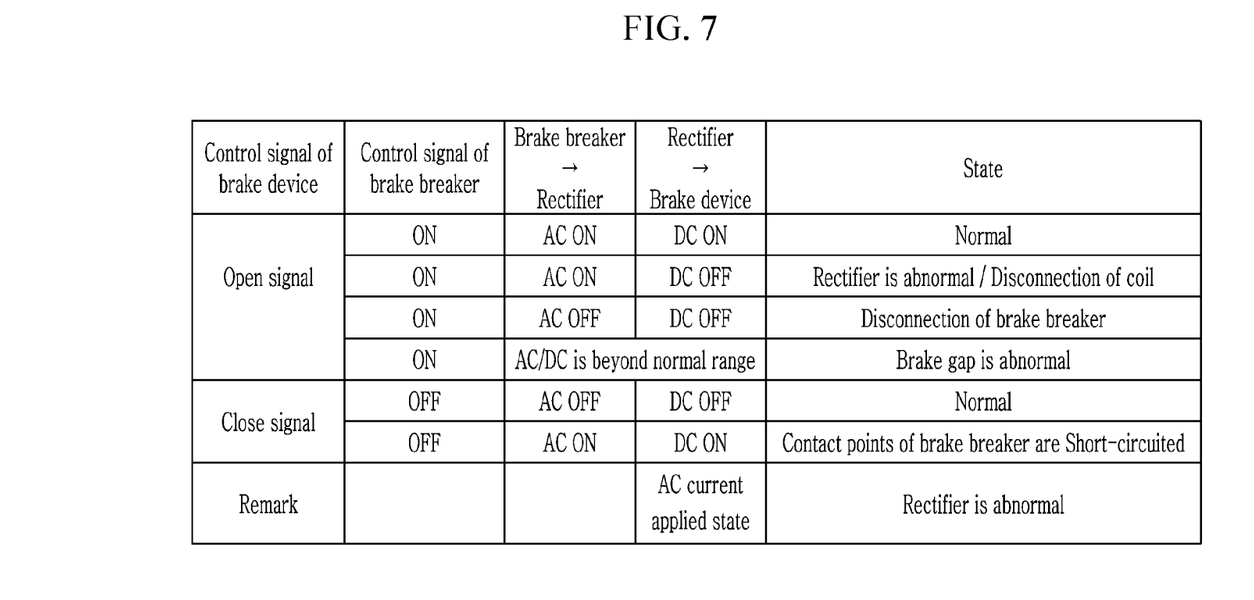
FIG. 7 is a table illustrating a method for a brake motor controller to determine whether a brake device is in an abnormal state according to an exemplary embodiment of the present invention.

Hereinafter, a method for determining whether the motor brake 110 is in a normal state or an abnormal state through the brake motor controller 300 will be described. The method may be executed by an overall controller having a processor and a memory. FIG. 7 is a table illustrating a method for a brake motor controller to determine whether a brake device is in an abnormal state according to an exemplary embodiment of the present invention.

When the control signal of the brake device 120 is an open signal, the control signal of the brake breaker 140 is an on signal, the AC current for being supplied to the rectifier 150 flows, and the DC current for being supplied to the brake device 120 flows through the rectifier 150, the brake motor controller 300 may be configured to determine that the circuit forming the brake device 120 is in a normal state. Herein, the open signal is the control signal output by the brake motor controller 300 to disengage the operation plate 122 and the fixed plate 121.

When the control signal of the brake device 120 is the open signal, the control signal of the brake breaker 140 is an on signal, the AC current for being supplied to the rectifier 150 flows, and the DC current for being supplied the brake device 120 does not flow through the rectifier 150, the brake motor controller 300 may be configured to determine that the rectifier 150 is in an abnormal state or a disconnection occurs in the coil 125 of the brake device 120. In particular, since the AC current is supplied normally to the rectifier 150 but the DC current is not supplied normally to the brake device 120 through the rectifier 150, the brake motor controller 300 may be configured to determine that the rectifier 150 is in an abnormal state or the coil 125 disposed in the electromagnet 124 of the brake device 120 is disconnected.

When the control signal of the brake device 120 is the open signal, the control signal of the brake breaker 140 is an on signal, the AC current for supplying to the rectifier 150 does not flow, and the DC current for being supplied to the rectifier 150 does not flow through the brake device 120, the brake motor controller 300 may be configured to determine that the brake breaker 140 is disconnected. When the control signal of the brake device 120 is the open signal, the control signal of the brake breaker 140 is the on signal, the DC current supplied to the brake device 120 through the rectifier 150 is beyond a normal range (e.g., not between the lower limit value and the upper limit value of FIG. 5 and FIG. 6), the brake motor controller 300 may be configured to determine that a brake gap between the fixed plate 121 and the operation plate 122 of the brake device 120 is abnormal.

A method of determining whether the over-current flows is the same as that of the foregoing description. The method to be described herein below may be executed by an overall controller having a processor and a memory. When the control signal of the brake device 120 is the close signal, the control signal of the brake breaker 140 is an off signal, the AC current for being supplied to the rectifier 150 does not flow, and the DC current for being supplied to the brake device 120 does not flow through the rectifier 150, the brake motor controller 300 may be configured to determine that the circuit forming the brake device 120 is in a normal state. In particular, the close signal is the control signal output by the brake motor controller 300 to engage the operation plate 122 and the fixed plate 121.

However, when the control signal of the brake device 120 is the close signal, the control signal of the brake breaker 140 is the off signal, the AC current for being supplied to the rectifier 150 flows, and the DC current for supplying to the brake device 120 flows through the rectifier 150, the brake motor controller 300 may be configured to determine that contact points of the brake breaker 140 are short-circuited. In particular, since the close signal of the brake device 120 is applied by the brake motor controller 300 but the AC current and the DC current flow to the brake device 120, the brake breaker 140 may be configured to determine that the contact points of the brake breaker 140 are short-circuited.

As described above, according to an exemplary embodiment of the present invention, it may be possible to determine whether the circuit forming the brake device 120 is in a normal state or an abnormal state using the additional monitoring portion 200, and the brake motor controller 300 and the monitoring portion 200 may be cooperatively operated to determine whether the circuit forming the brake device 120 is in a normal state or an abnormal state. Accordingly, since the abnormal state of the circuit forming the motor brake 110 may be determined based on the state information of the brake motor 100 in real time, it may be possible to rapidly establish countermeasures regarding a problem generated in the circuit forming the brake motor 100 in advance.

DESCRIPTION OF SYMBOLS

100: brake motor
110: motor
120: brake device
121: fixed plate
122: operation plate
123: brake lining
124: electromagnet
125: coil
126: spring
130: motor breaker
140: brake breaker
150: rectifier
200: monitoring portion
210: AC current measuring instrument
220: DC current measuring instrument
230: signal transformer
240: relay
250: monitoring controller
260: lamp
300: brake motor controller
400: manager server
500: manager terminal
600: alarm portion While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An apparatus for monitoring a brake motor, comprising:
a monitoring portion configured to measure state information of the brake motor including a motor and a brake device, and determine a state of the brake device based on the state information and a control signal of a brake motor controller configured to operate the brake motor or adjust a control current supplied to the brake device,
wherein the monitoring portion includes:
an alternating current (AC) current measuring instrument configured to measure an AC current supplied to a rectifier configured to convert the AC current into a direct-current (DC) current supplied to the brake device;
a DC current measuring instrument configured to measure the DC current supplied to the brake device through the rectifier;
a relay configured to selectively cut the AC current supplied to the rectifier; and
a monitoring controller configured to transmit a state of the AC current and the DC current based on a control signal of the brake motor controller to the brake motor controller, determine a state of the brake device based on the state of the AC current and the DC current based on a control signal of the brake motor controller, and operate the relay.

2. The apparatus of claim 1, wherein the monitoring controller is further configured to:
determine that a disconnection occurs in a brake breaker that selectively cuts the AC current supplied to the brake device when the control signal of the brake device output by the brake motor controller is an open signal and an AC current does not flow at an upstream side of the rectifier,
determine that the rectifier is in an abnormal state or a disconnection occurs in a coil of the brake device when the DC current does not flow at a downstream side of the rectifier, or
determine that the rectifier is in an abnormal state when the AC current flows at a downstream side of the rectifier.

3. The apparatus of claim 1, wherein the monitoring controller is configured to determine that a short-circuit occurs in a contact point of a brake breaker for selectively cutting the AC current supplied to the brake device when the control signal of the brake device output by the brake motor controller is a close signal and the AC current or the DC current supplied to the brake device flows.

4. The apparatus of claim 1, wherein the monitoring controller is configured to determine that a brake gap of the brake device is abnormal when the control signal of the brake device output by the brake motor controller is an open signal and the AC current at the upstream side of the rectifier is greater than a predetermined AC current or the DC current at the downstream side of the rectifier is greater than a predetermined DC current.

5. The apparatus of claim 4, wherein the monitoring controller is configured to determine that an over-current is supplied to the brake device when the AC current or the DC current supplied to the brake device consistently exceeds an upper limit value for a predetermined time.

6. The apparatus of claim 4, wherein the monitoring controller is configured to determine that an over-current is supplied to the brake device when a number of inflection points of the AC current or the DC current supplied to the brake device that exceed an upper limit value exceeds a predetermined number for a predetermined time.

7. The apparatus of claim 5, wherein the monitoring controller is configured to determine whether an over-current flows by comparing a squared value of the AC current or the DC current supplied to the brake device with a square valued of the upper limit value.

8. The apparatus of claim 6, wherein the monitoring controller is configured to determine whether an over-current flows by comparing a squared value of the AC current or the DC current supplied to the brake device with a square valued of the upper limit value.

9. The apparatus of claim 2, wherein the monitoring controller turns off the relay when it is determined that the brake device is in an abnormal state.

10. The apparatus of claim 3, wherein the monitoring controller turns off the relay when it is determined that the brake device is in an abnormal state.

11. The apparatus of claim 4, wherein the monitoring controller turns off the relay when it is determined that the brake device is in an abnormal state.

12. The apparatus of claim 2, further comprising
a manager server configured to connected with the monitoring portion through a wired or wireless network,
wherein the monitoring controller transmits an abnormal state signal to the manager server when the brake device is in an abnormal state.

13. The apparatus of claim 3, further comprising
a manager server configured to connected with the monitoring portion through a wired or wireless network,
wherein the monitoring controller transmits an abnormal state signal to the manager server when the brake device is in an abnormal state.

14. The apparatus of claim 4, further comprising
a manager server configured to connected with the monitoring portion through a wired or wireless network,
wherein the monitoring controller transmits an abnormal state signal to the manager server when the brake device is in an abnormal state.

15. The apparatus of claim 1, further comprising:
a lamp electrically connected with the monitoring controller; and
an alarm portion electrically connected to the brake motor controller,
wherein the lamp and the alarm portion generate an alarm signal in response to a determination that the brake device is in an abnormal state.

16. The apparatus of claim 1, wherein the brake motor controller is configured to determine that the rectifier is in an abnormal state or a coil of the brake device is disconnected when the control signal of the brake device output by the brake motor controller is an open signal, the control signal of the brake breaker selectively cutting off the AC current supplied to the brake device is an on signal, the AC current supplied to the rectifier flows, and the DC current supplied to the brake device through the rectifier flows.

17. The apparatus of claim 1, wherein the brake motor controller is configured to determine that the brake breaker is disconnected when the control signal of the brake device output by the brake motor controller is an open signal, the control signal of the brake breaker selectively cutting off the AC current supplied to the brake device is an on signal, the AC current supplied to the rectifier does not flow, and the DC current supplied to the brake device through the rectifier does not flow.

18. The apparatus of claim 1, wherein, when the control signal of the brake device output by the brake motor controller is the open signal, the control signal of the brake breaker selectively cutting off the AC current for being supplied to the brake device is an on signal, and the DC current supplied to the brake device through the rectifier is beyond a normal range, the brake motor controller is configured to determine that a brake gap of the brake device is abnormal.

19. The apparatus of claim 1, wherein when the control signal of the brake device output by the brake motor controller is a close signal, the control signal of the brake breaker selectively cutting off the AC current for being supplied to the brake device is an off signal, the AC current for being supplied to the rectifier flows, and the DC current for supplying to the brake device through the rectifier flows, the brake motor controller is configured to determine that contact points of the brake breaker are short-circuited.

* * * * *